US011790977B2

(12) United States Patent
Wu et al.

(10) Patent No.: US 11,790,977 B2
(45) Date of Patent: Oct. 17, 2023

(54) TRANSMITTER WITH VOLTAGE LEVEL ADJUSTMENT MECHANISM IN MEMORY CONTROLLER

(71) Applicant: MEDIATEK INC., Hsin-Chu (TW)

(72) Inventors: Chung-Hwa Wu, Hsinchu (TW); Ming-Hsin Yu, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 17/349,934

(22) Filed: Jun. 17, 2021

(65) Prior Publication Data

US 2022/0020419 A1 Jan. 20, 2022

Related U.S. Application Data

(60) Provisional application No. 63/092,530, filed on Oct. 16, 2020, provisional application No. 63/053,763, filed on Jul. 20, 2020.

(51) Int. Cl.
*G11C 11/4074* (2006.01)
*G11C 11/406* (2006.01)
*G11C 11/4094* (2006.01)

(52) U.S. Cl.
CPC ........ *G11C 11/4074* (2013.01); *G11C 11/406* (2013.01); *G11C 11/4094* (2013.01)

(58) Field of Classification Search
CPC .............. G11C 11/4074; G11C 11/406; G11C 11/4094; G11C 11/4093; G11C 5/063; G11C 7/1084; G11C 7/22; G11C 29/021; G11C 29/028; G06F 13/4077
See application file for complete search history.

(56) References Cited

U.S. PATENT DOCUMENTS

2004/0240248 A1* 12/2004 Kang ................. G11C 11/22
365/145
2008/0079457 A1 4/2008 Yuan
2011/0084725 A1 4/2011 Bhakta
2011/0314200 A1* 12/2011 Wilson ............... G06F 13/4234
710/316

(Continued)

FOREIGN PATENT DOCUMENTS

EP 1642298 B1 * 10/2010 ............. G11C 11/15
EP 3 203 475 A1 8/2017
KR 20160060726 A * 5/2016

OTHER PUBLICATIONS

Method for Reducing Power Consumption When Sensing a Resistive Memory; Baker Jacob R (Year: 2004).*

*Primary Examiner* — Sultana Begum
(74) *Attorney, Agent, or Firm* — Winston Hsu

(57) ABSTRACT

The present invention provides a memory controller including a plurality of channels. A first channel of the plurality of channels includes a first transmitter, a first pull-up variable resistor and a first pull-down variable resistor, wherein the first transmitter is configured to generate a first data signal to a memory module, the first pull-up variable resistor is coupled between a supply voltage and an output terminal of the first transmitter, and the first pull-down variable resistor is coupled to the output terminal of the first transmitter. The control circuit is coupled to the plurality of channels, and is configured to control the first pull-up variable resistor and/or the first pull-down variable resistor according to a reference voltage used by the memory module.

20 Claims, 6 Drawing Sheets

(56) References Cited

U.S. PATENT DOCUMENTS

| | | | |
|---|---|---|---|
| 2012/0326768 A1* | 12/2012 | Bhattacharya | H03F 1/308 |
| | | | 327/524 |
| 2018/0167055 A1 | 6/2018 | Gans | |
| 2019/0080745 A1 | 3/2019 | Kim | |
| 2019/0296691 A1 | 9/2019 | Finn | |
| 2019/0334519 A1 | 10/2019 | Sawada | |
| 2021/0096588 A1* | 4/2021 | Kong | H04L 25/0292 |

* cited by examiner

TRANSMITTER WITH VOLTAGE LEVEL ADJUSTMENT MECHANISM IN MEMORY CONTROLLER

CROSS REFERENCE TO RELATED APPLICATIONS

This application claims the priority of U.S. Provisional Application No. 63/053,763 (filed on Jul. 20, 2020) and U.S. Provisional Application No. 63/092,530 (filed on Oct. 16, 2020), which is included herein by reference in its entirety.

BACKGROUND

In a dynamic random access memory (DRAM) system, there are a plurality of channels between a DRAM controller and a DRAM module, for transmissions of data signals (i.e., DQ signal). Each channel can be used for bi-directional data transmission, that is the DRAM controller has a transmitter and a receiver for each channel, and the DRAM module also has a transmitter and a receiver for each channel. When the DRAM controller transmits DQ signals to the DRAM module via the plurality of channels, receivers of the DRAM module can use a reference voltage to determine logical values (i.e., bits) of the DQ signals. For example, if a receiver determines that a voltage level of the DQ signal is higher than the reference voltage, the receiver can determine that the DQ signal has a logical value '1'; and if the receiver determines that the voltage level of the DQ signal is lower than the reference voltage, the receiver can determine that the DQ signal has a logical value '0'. Ideally, the reference voltage used by the receivers should be an average of highest voltage level and a lowest voltage level of the DQ signal. However, due to the channel mismatch and semiconductor process variation, the voltage levels of the plurality of channels may be different, that is the single reference voltage is not suitable for every receiver. Furthermore, near-ground signaling (NGS) is widely adopted in modern low-power DRAM interface, and the DQ signals using the NGS technology generally have lower swing and higher speed. Therefore, if the reference voltage is not suitable for some receivers, the misjudgment of logical values will become more serious.

SUMMARY

It is therefore an objective of the present invention to provide a memory controller having a plurality of transmitter, wherein each transmitter can be controlled to output data signal with an appropriate voltage level, so that the receivers of the memory module can use the same reference voltage to accurately determine the logical values of the data signals, to solve the above-mentioned problems.

According to one embodiment of the present invention, a memory controller comprises a plurality of channels is disclosed. A first channel of the plurality of channels comprises a first transmitter, a first pull-up variable resistor and a first pull-down variable resistor, wherein the first transmitter is configured to generate a first data signal to a memory module, the first pull-up variable resistor is coupled between a supply voltage and an output terminal of the first transmitter, and the first pull-down variable resistor is coupled to the output terminal of the first transmitter. The control circuit is coupled to the plurality of channels, and is configured to control the first pull-up variable resistor and/or the first pull-down variable resistor according to a reference voltage used by the memory module.

According to another embodiment of the present invention, a memory system comprising a memory controller and a memory module is disclosed. The memory controller comprises a plurality of transmitters, wherein the transmitters are configured to generate a plurality of data signals, respectively; and the memory module comprises a plurality of receivers, wherein the receivers compare the plurality of data signals with a reference voltage to generate a plurality of output signals, respectively. The plurality of transmitters comprise a first transmitter, the memory controller further comprises a first pull-up variable resistor and a first pull-down variable resistor, wherein the first pull-up variable resistor is coupled between a supply voltage and an output terminal of the first transmitter, and the first pull-down variable resistor is coupled to the output terminal of the first transmitter; and the memory controller further comprises a control circuit configured to control the first pull-up variable resistor and/or the first pull-down variable resistor according to the reference voltage used by the memory module.

According to another embodiment of the present invention, a control method of a memory controller is disclosed, wherein the memory controller comprises a plurality of channels. A first channel of the plurality of channels comprises a first transmitter, a first pull-up variable resistor and a first pull-down variable resistor, wherein the first pull-up variable resistor is coupled between a supply voltage and an output terminal of the first transmitter, and the first pull-down variable resistor is coupled to the output terminal of the first transmitter. The control method comprises the steps of: controlling the first pull-up variable resistor and/or the first pull-down variable resistor according to a reference voltage used by the memory module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
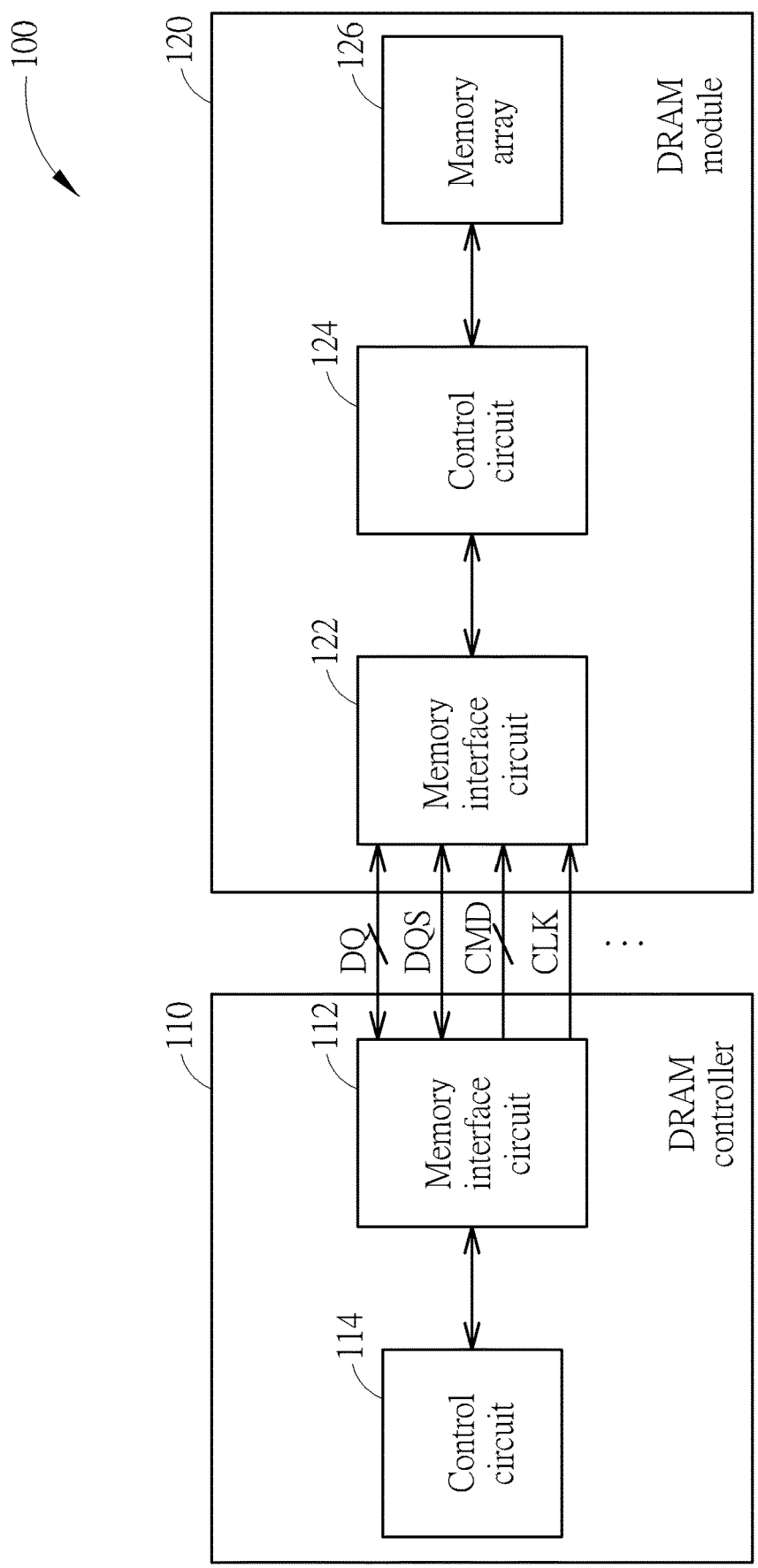
FIG. 1 is a diagram illustrating a memory system according to one embodiment of the present invention.

FIG. 1 is a diagram illustrating a memory system 100 according to one embodiment of the present invention. As shown in FIG. 1, the memory system 100 comprises a memory controller (in this embodiment, a DRAM controller 110 serve as the memory controller) and a memory module (in this embodiment, a DRAM module 120 serves as the memory module), where the DRAM controller 110 comprises a memory interface circuit 112 and a control circuit 114, and the DRAM module 120 comprises a memory interface circuit 122, a control circuit 124 and a memory array 126. In this embodiment, the DRAM controller 110 and the DRAM module 120 are connected via a plurality of connection lines, where the connection lines are used to transmit at least a plurality of a bi-directional data signal DQ, a bi-directional data strobe signal DQS, a plurality of command signals CMDs, a differential clock signal CLK.

When the memory system 100 is implemented by a DRAM system, the command signals may comprise at least a row address strobe, a column address strobe, and a write enable signal. In addition, the clock signal or the command signals shown in FIG. 1 can be single-directional or bi-directional.

In the general operations of the memory system 100, the DRAM controller 110 is arranged to receive a request from a host or a processor, and to transmit at least a portion of the data signal DQ, data strobe signal DQS, command signals CMDs, the clock signal CLK and the clock enable signal CKE to access the DRAM module 120. In addition, the control circuit 114 within the DRAM controller 110 may comprise associated circuits, such as a processing circuit, a write/read buffer, a control logic and an arbiter, to perform the related operations. The memory interface circuit 112 of the DRAM controller 110 is arranged to output the data signal DQ, data strobe signal DQS, command signals CMDs, the clock signal CLK to the DRAM module 120. The memory interface circuit 122 is arranged to receive the data signal DQ, data strobe signal DQS, command signals CMDs and the clock signal CLK from the DRAM controller 110, and to output the data to the DRAM controller 110 via the DQ connection lines. The control circuit 124 may comprise a read/write controller, a row decoder and a column decoder, and the control circuit 124 is arranged to receive output signals from the memory interface circuit 122 to access the memory array 126.

Figure 2:
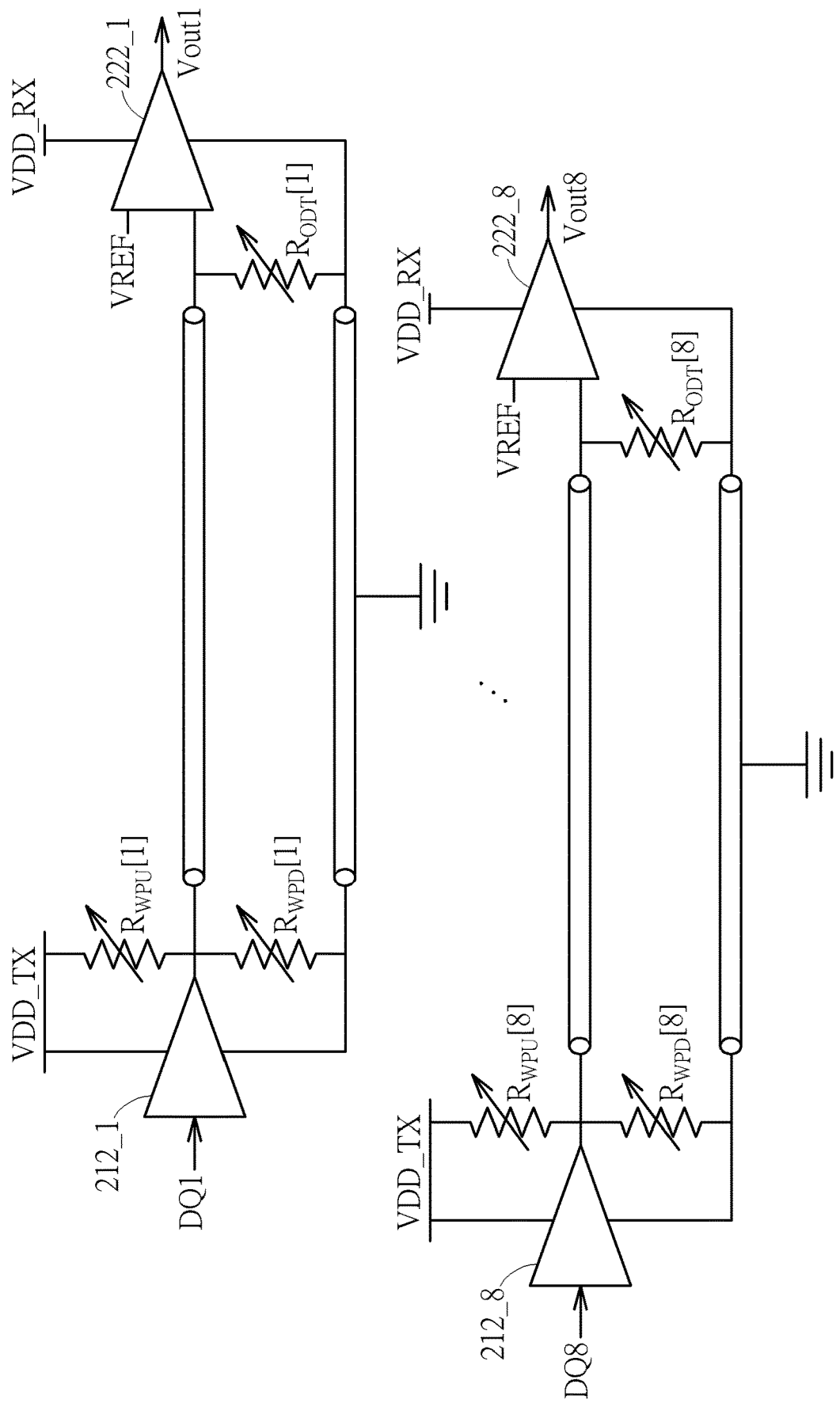
FIG. 2 shows some transmitters within the memory interface circuit of DRAM controller and some receivers within the memory interface circuit of DRAM module according to one embodiment of the present invention.

FIG. 2 shows some transmitters 212_1-212_8 within the memory interface circuit 112 and some receivers 222_1-222_8 within the memory interface circuit 122 according to one embodiment of the present invention. In this embodiment, FIG. 2 shows eight channels between the DRAM controller 110 and the DRAM module 120, and the eight channels are configured to transmit the data signals DQ. Regarding a first channel shown in FIG. 2, the transmitter 212_1 is coupled between a supply voltage VDD_TX and a reference voltage (e.g. a ground voltage), and the receiver 222_1 is coupled between a supply voltage VDD_RX and the reference voltage (e.g. the ground voltage); and the transmitter 212_1 is configured to receive and output a data signal DQ1 to the receiver 222_1, and the receiver 222_1 compares the data signal DQ1 with a reference voltage VREF to generate an output signal Vout1, wherein if the data signal DQ1 is greater than the reference voltage VREF, the output signal Vout1 has a higher level indicating that the data signal DQ1 has a logical value '1'; and if the data signal DQ1 is lower than the reference voltage VREF, the output signal Vout1 has a lower level indicating that the data signal DQ1 has a logical value '0'. Similarly, works of the other channels are similar to the work of the first channel. For example, the transmitter 212_8 is coupled between the supply voltage VDD_TX and the ground voltage, and the receiver 222_8 is coupled between a supply voltage VDD_RX and the ground voltage; and the transmitter 212_8 is configured to receive and output a data signal DQ8 to the receiver 222_8, and the receiver 222_8 compares the data signal DQ8 with the reference voltage VREF to generate the output signal, wherein if the data signal DQ8 is greater than the reference voltage VREF, the output signal Vout8 has a higher level indicating that the data signal DQ8 has a logical value '1'; and if the data signal DQ8 is lower than the reference voltage VREF, the output signal Vout8 has a lower level indicating that the data signal DQ8 has a logical value '0'.

As described in the background, due to the channel mismatch and semiconductor process variation, the voltage levels of the plurality of channels (i.e. the transmitted DQ signals of the transmitters 212_1-212_8) may be different, that is the single reference voltage VREF is not suitable for every receiver 222_1-222_8. To solve this problem, in the memory interface circuit 112, each of the transmitters 212_1-212_8 has a voltage level adjustment mechanism to adjust a voltage level of the transmitted DQ signal, so that a middle voltage level of each data signal DQ can be as close to the reference voltage VREF as possible, wherein the middle voltage level may be an average of a highest voltage level and a lowest voltage level of the data signal DQ. Specifically, taking the first channel as an example, a pull-up variable resistor $R_{WPU}[1]$ is coupled between the supply voltage VDD_TX and an output terminal of the transmitter 212_1, and a pull-down variable resister $R_{WPD}[1]$ is coupled between the ground voltage and the output terminal of the transmitter 212_1. In one embodiment, in the operations of the memory system 100, the DRAM module 120 may calibrate the reference voltage VREF based on training signals to determine an appropriate level for the reference voltage VREF, and the DRAM module 120 can feedback the information of the reference voltage VREF to the DRAM controller 110, so that the control circuit 114 can control the pull-up variable resistor $R_{WPU}[1]$ and/or the pull-down variable resister $R_{WPD}[1]$ to make the middle voltage level of the DQ1 is as close to the reference voltage VREF as possible. In another embodiment, the DRAM module 120 may feedback a bit error rate or a bit error count to the DRAM controller 110, so that the control circuit 114 can control the pull-up variable resistor $R_{WPU}[1]$ and/or the pull-down variable resister $R_{WPU}[1]$ to have the lowest error rate or the bit error count (it also means that the middle voltage level of the DQ1 received by the receiver 222_1 is very close to the reference voltage VREF).

Similarly, voltage level adjustment mechanism of the other channels is similar to the mechanism of the first channel. Taking the eighth channel as an example, a pull-up variable resistor $R_{WPU}[8]$ is coupled between the supply voltage VDD_TX and an output terminal of the transmitter 212_8, and a pull-down variable resister $R_{WPD}[8]$ is coupled between the ground voltage and the output terminal of the transmitter 212_8. In one embodiment, in the operations of the memory system 100, the DRAM module 120 may calibrate the reference voltage VREF based on the training signals to determine the appropriate level for the reference voltage VREF, and the DRAM module 120 can feedback the information of the reference voltage VREF to the DRAM controller 110, so that the control circuit 114 can control the pull-up variable resistor $R_{WPU}[8]$ and/or the pull-down variable resister $R_{WPD}[8]$ to make the middle voltage level of the DQ8 is as close to the reference voltage VREF as possible. In another embodiment, the DRAM module 120 may feedback a bit error rate or a bit error count to the DRAM controller 110, so that the control circuit 114 can control the pull-up variable resistor $R_{WPU}[8]$ and/or the pull-down variable resister $R_{WPD}[8]$ to have the lowest error rate or the bit error count (it also means that the middle voltage level of the DQ8 received by the receiver 222_8 is very close to the reference voltage VREF).

Figure 3:
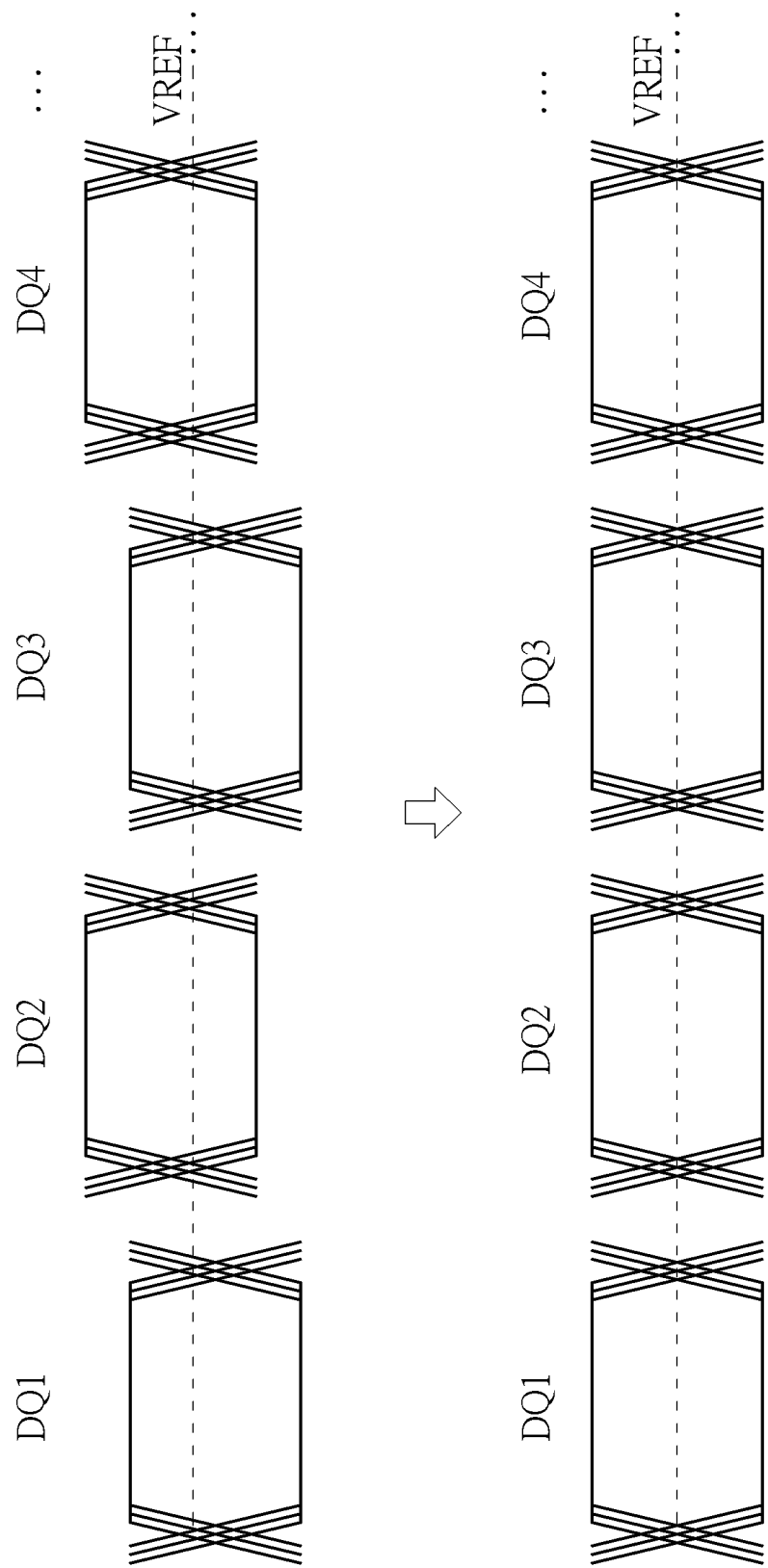
FIG. 3 shows data signals without the voltage level adjustment mechanism and data signals with the voltage level adjustment mechanism according to one embodiment of the present invention.

FIG. 3 shows data signals without the voltage level adjustment mechanism and data signals with the voltage level adjustment mechanism according to one embodiment of the present invention. Referring to an upper part of FIG. 3, if the memory interface circuit 112 does not have the voltage level adjustment mechanism (i.e., the pull-up variable resistor $R_{WPU}[1]$-$R_{WPU}[8]$ and/or the pull-down variable resister $R_{WPD}[1]$-$R_{WPD}[8]$ do not appear in FIG. 2), the reference voltage VREF may not be suitable for determining a logical value of each data signal. For example, the middle voltage level of the data signal DQ1 is lower than the reference voltage VREF, the middle voltage level of the data signal DQ2 is higher than the reference voltage VREF, the middle voltage level of the data signal DQ1 is lower than the reference voltage VREF, the middle voltage level of the data signal DQ1 is equal to the reference voltage VREF. Referring to a lower part of FIG. 3, by controlling the pull-up variable resistor $R_{WPU}[1]$-$R_{WPU}[8]$ and/or the pull-down variable resister $R_{WPD}[1]$-$R_{WPD}[8]$ of the channels, every data signal DQ1-DQ8 has the middle voltage level that is equal to or very close to the reference voltage VREF, so that the reference voltage VREF is suitable for determining logical values of each of the data signals DQ1-DQ8.

In the embodiment shown in FIG. 2, the pull-up variable resistors $R_{WPU}[1]$-$R_{WPU}[8]$ are weakly-pull-high resistors, and the pull-down variable resistors $R_{WPD}[1]$-$R_{WPD}[8]$ are weakly-pull-high resistors. Therefore, each of the pull-up variable resistors $R_{WPU}[1]$-$R_{WPU}[8]$ and pull-down variable resistors $R_{WPD}[1]$-$R_{WPD}[8]$ has higher resistance. In addition, the memory interface circuit 122 of the DRAM module 120 has on-die termination resistors $R_{ODT}[1]$-$R_{ODT}[8]$ for improving the impedance mismatch in transmission lines, wherein the on-die termination resistors $R_{ODT}[1]$-$R_{ODT}[8]$ are positioned at the input terminals of the receivers 222_1-222_8, respectively. In this embodiment, the resistance of each of pull-up variable resistors $R_{WPU}[1]$-$R_{WPU}[8]$ and pull-down variable resistors $R_{WPD}[1]$-$R_{WPD}[8]$ is much higher than the resistance of each of the on-die termination resistors $R_{ODT}[1]$-$R_{ODT}[8]$, for example, the resistance of the variable resistor $R_{WPU}[1]/R_{WPD}[1]$ is several hundred times the resistance of the on-die termination resistor $R_{ODT}[1]$.

Figure 4:
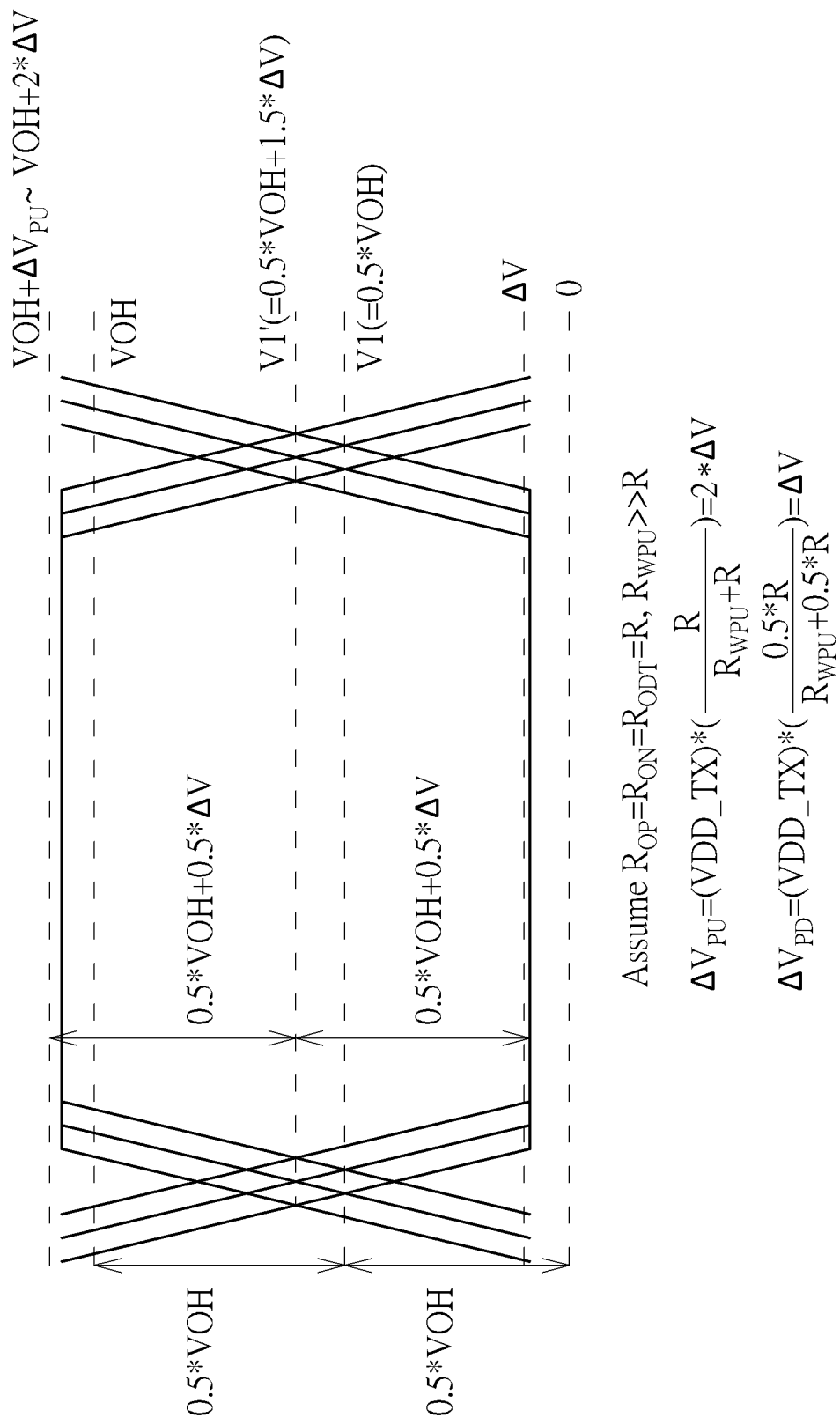
FIG. 4 shows an adjustment of the middle voltage level of the data signal DQ according to one embodiment of the present invention

FIG. 4 shows an adjustment of the middle voltage level of the data signal DQ (e.g. each of DQ1-DQ8) according to one embodiment of the present invention, wherein the symbol $R_{ODT}$ can be used to represent each of the on-die termination resistors $R_{ODT}[1]$-$R_{ODT}[8]$, the symbol $R_{WPU}$ can be used to represent each of the pull-up variable resistors $R_{WPU}[1]$-$R_{WPU}[8]$, and the symbol $R_{OP}/R_{ON}$ is used to represent the output impedance of each of the transmitters 212_1-212_8. As shown in FIG. 4, assuming that the data signal DQ initially has a highest voltage level VOH and a lowest voltage level 0V, the middle voltage level V1 of the data signal DQ is equal to 0.5*VOH, the output impedance $R_{OP}/R_{ON}$ of the transmitter and the resistance of the on-die termination resistor ODT is equal to 'R', and the resistance of the pull-up variable resistor $R_{WPU}$ is much greater than 'R'. The control circuit 114 can control the resistance of the pull-up variable resistor $R_{WPU}$ to increase the lowest voltage level and the highest voltage level of the data signal DQ, and the equations showing an increase of lowest voltage level and an increase of highest voltage level are as follows:

$$\Delta VPD = (VDD\_TX) * ((0.5*R)/(R_{WPU}+0.5*R)) = \Delta V \quad (1);$$

$$\Delta VPU = (VDD\_TX) * R/(R_{WPU}+R)) = 2*\Delta V \quad (2).$$

Therefore, since the new highest voltage level becomes VOH+2*ΔV, and the new highest lowest voltage level becomes ΔV, the control circuit 114 can determine that the middle voltage level V1' of the data signal DQ becomes (0.5*VOH+1.5*ΔV).

Figure 5:
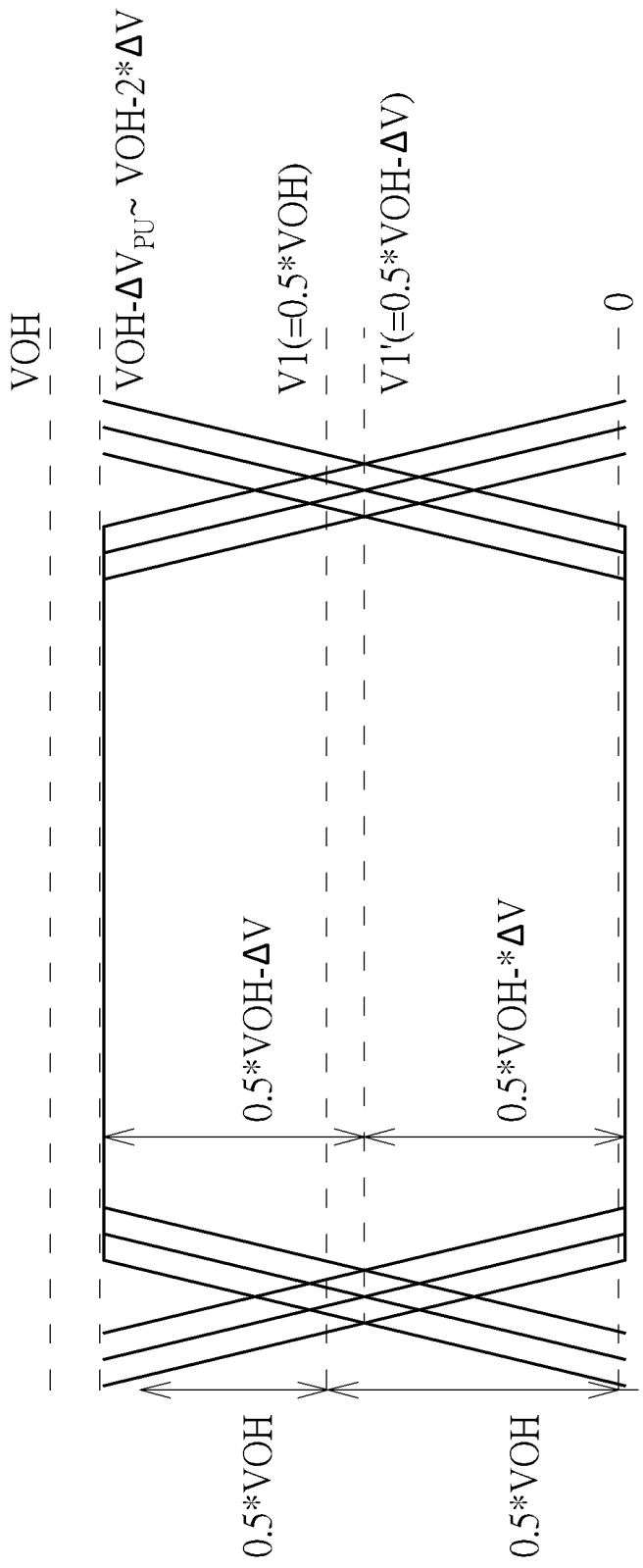
FIG. 5 shows an adjustment of the middle voltage level of the data signal DQ according to one embodiment of the present invention

FIG. 5 shows an adjustment of the middle voltage level of the data signal DQ (e.g. each of DQ1-DQ8) according to one embodiment of the present invention, wherein the symbol $R_{ODT}$ can be used to represent each of the on-die termination resistors $R_{ODT}[1]$-$R_{ODT}[8]$, the symbol $R_{WPD}$ can be used to represent each of the pull-down variable resistors $R_{WPD}[1]$-$R_{WPD}[8]$, and the symbol $R_{OP}/R_{ON}$ is used to represent the output impedance of each of the transmitters 212_1-212_8. As shown in FIG. 5, assuming that the data signal DQ initially has a highest voltage level VOH and a lowest voltage level 0V, the middle voltage level V1 of the data signal DQ is equal to 0.5*VOH, the output impedance $R_{OP}/R_{ON}$ of the transmitter and the resistance of the on-die termination resistor $R_{ODT}$ is equal to 'R', and the resistance of the pull-up variable resistor $R_{WPU}$ is much greater than 'R'. The control circuit 114 can control the resistance of the pull-down variable resistor $R_{WPD}$ to decrease the highest voltage level of the data signal DQ, and the equations showing a decrease of highest voltage level are as follows:

$$\Delta VPU = -1 * (VDD\_TX) * R/(R_{WPD}+R)) = 2*\Delta V \quad (3).$$

Therefore, since the new highest voltage level becomes VOH−2*ΔV, the control circuit 114 can determine that the middle voltage level V1' of the data signal DQ becomes (0.5*VOH−ΔV).

FIG. 4 shows the relationship between the pull-up variable resistor $R_{WPU}$ and the middle voltage level of the data signal DQ, and FIG. 5 shows the relationship between the pull-down variable resistor $R_{WPD}$ and the middle voltage level of the data signal DQ, therefore, the control circuit 114 can determine the suitable middle voltage level of the data signal DQ by controlling the resistance of the variable resistors $R_{WPU}$ and $R_{WPD}$.

It is noted that the embodiments shown in FIG. 4 and FIG. 5 are for illustrative purposes only. In other embodiments, a look-up table may be built in a test stage of the memory system 100, and the control circuit 114 may refer to the reference voltage REF and the look-up table to determine the appropriate resistance of the variable resistors $R_{WPU}$ and $R_{WPD}$.

Figure 6:
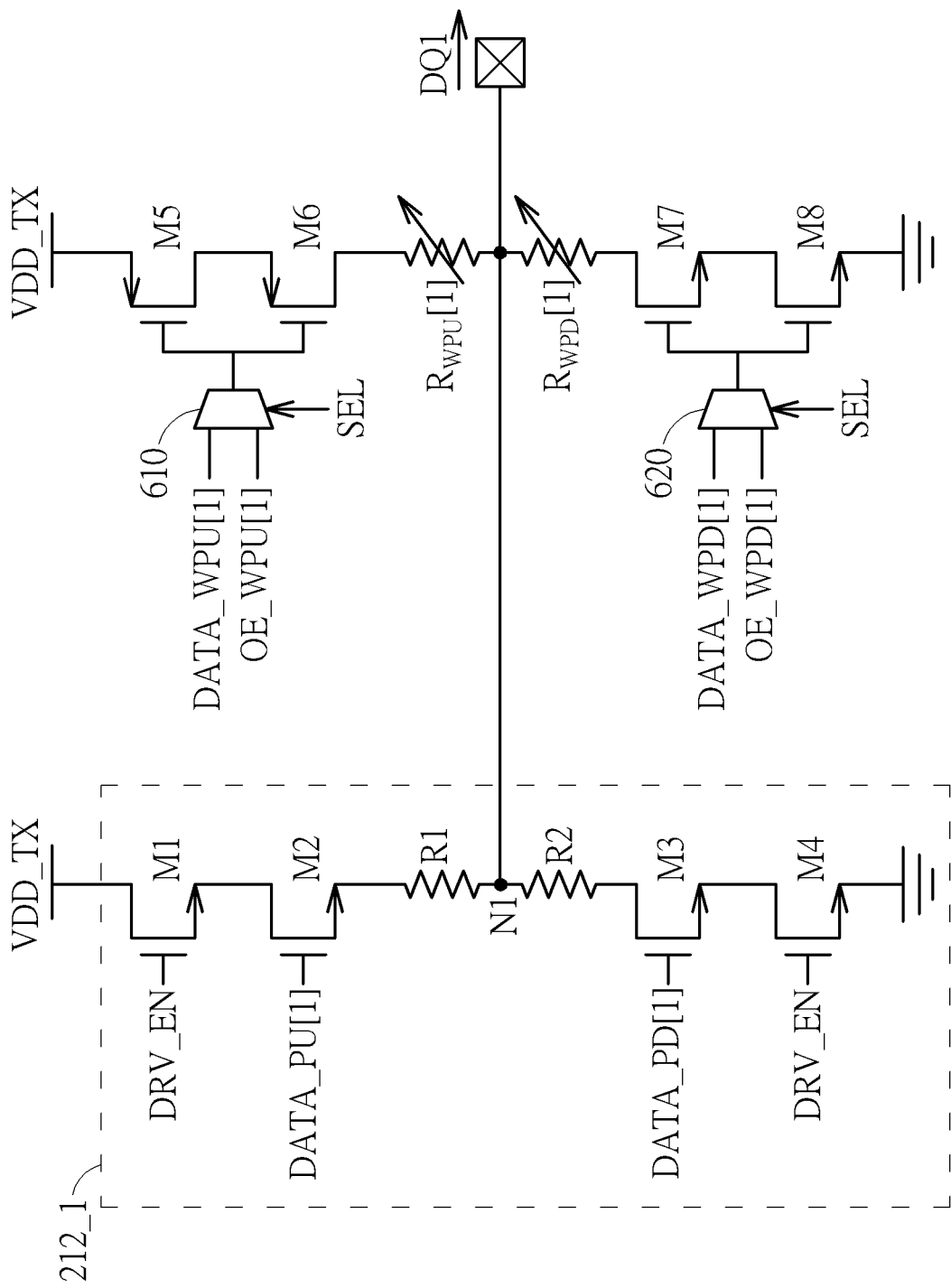
FIG. 6 is diagram illustrating a transmitter and related circuits according to one embodiment of the present invention.

FIG. 6 is diagram illustrating a transmitter and related circuits according to one embodiment of the present invention, wherein the transmitter 212_1 shown in FIG. 2 is used as an example, but the structure shown in FIG. 6 can be applied to any one of the transmitters 212_1-212_8. As shown in FIG. 6, the transmitter 212_1 comprises transistors M1-M4 and two resistors R1 and R2, wherein a drain electrode of the transistor M1 is coupled to the supply voltage VDD_TX, a drain electrode of the transistor M2 is coupled to a source electrode of the transistor M1, and a source electrode of the transistor M2 is coupled to an output terminal N1 via the resistor R1; and a source electrode of the transistor M4 is coupled to the ground voltage, a source electrode of the transistor M3 is coupled to a drain electrode of the transistor M3, and a drain electrode of the transistor M3 is coupled to the output terminal N1 via the resistor R2. The transistors M1 and M4 are controlled by a driver enable signal DRV_EN, wherein the driver enable signal DRV_EN is configured to enable the transistors M1 and M4 to allow the transmitter 212_1 to transmit the data signal, and to disable the transistors M1 and M4 to make the transmitter 212_1 be unable to transmit the data signal. The transistors M2 and M3 are controlled by a pull-up signal DATA_PU[1] and a pull-down signal DATA_PD[1], respectively, wherein the transmitter 212_1 will output the data signal with a higher voltage level if the transistor M2 is enabled while the transistor M3 is disabled; and the transmitter 212_1 will output the data signal with a lower voltage level if the transistor M2 is disabled while the transistor M3 is enabled.

In addition, FIG. 6 further comprises transistors M5-M8 and multiplexers 610 and 620, wherein a source electrode of the transistor M5 is coupled to the supply voltage VDD_TX, a source electrode of the transistor M6 is coupled to a drain electrode of the transistor M5, and a drain electrode of the transistor M6 is coupled to the output terminal N1 via the pull-up variable resistor $R_{WPU}[1]$; and a source electrode of the transistor M8 is coupled to the ground voltage, a source electrode of the transistor M7 is coupled to a drain electrode of the transistor M8, and a drain electrode of the transistor M7 is coupled to the output terminal N1 via the pull-down variable resistor $R_{WPD}[1]$. In this embodiment, the transistors M5 and M6 serve as a switching circuit to selectively connect the supply voltage VDD_TX to the pull-up variable resistor $R_{WPU}[1]$, and the transistors M7 and M8 serve as another switching circuit to selectively connect the ground voltage to the pull-down variable resistor $R_{WPD}[1]$. The multiplexer 610 receives a dynamic mode pull-up signal DATA_WPU[1] and a static mode pull-up signal OE_WPU [1], and selects one of the dynamic mode pull-up signal DATA_WPU[1] and the static mode pull-up signal OE_WPU[1] to generate a first multiplexer signal according to a selection signal SEL, to control the transistors M5 and M6; and the multiplexer 620 receives a dynamic mode pull-down signal DATA_WPD[1] and a static mode pull-down signal OE_WPD[1], and selects one of the dynamic mode pull-down signal DATA_WPD[1] and the static mode pull-down signal OE_WPD[1] to generate a second multiplexer signal according to the selection signal SEL, to control the transistors M7 and M8. In this embodiment, the static mode means that the transistors M5-M8 are always enabled if the transmitter 212_1 is allowed to transmit the data signal DQ1 (e.g., when an output enable (OE) signal of the DRAM interface is on), and the dynamic mode means that the transistors M5-M8 are enabled only when the transmitter 212_1 transmits the data signal DQ1, that is the transistors M5-M8 are controlled to be enabled or disabled bit-by-bit, wherein the dynamic mode can lower the power consumption.

In the above embodiments, all the transmitters 212_1-212_8 have the voltage level adjustment mechanism to adjust the voltage levels of the data signals DQ1-DQ8, respectively. However, the present invention is not limited to this. In other embodiments, only part of the transmitters 212_1-212_8 have the voltage level adjustment mechanism, and the voltage levels of the data signals outputted by the other transmitters are not controlled according to the reference voltage VREF of the DRAM module 120. This alternative design shall fall within the scope of the present invention.

Briefly summarized, in the DRAM controller of the present invention, each transmitter can be controlled to output data signal with an appropriate voltage level, so that the receivers of the memory module can use the same reference voltage to accurately determine the logical values of the data signals. Therefore, the voltage level adjustment mechanism of the DRAM controller can improve the performance of the receivers in the DRAM module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A memory controller, comprising:
    a plurality of channels, wherein a first channel of the plurality of channels comprises:
        a first transmitter, configured to generate a first data signal to a memory module;
        a first pull-up variable resistor, coupled between a supply voltage and an output terminal of the first transmitter; and
        a first pull-down variable resistor, coupled to the output terminal of the first transmitter; and
    a control circuit, coupled to the plurality of channels, configured to control the first pull-up variable resistor and/or the first pull-down variable resistor according to a reference voltage used by the memory module;
    wherein the control circuit is configured to control the first pull-up variable resistor and/or the first pull-down variable resistor to make a specific voltage level of the first data signal outputted by the first transmitter is equal to the reference voltage used by the memory module, wherein the specific voltage level of the first data signal is lower than a highest voltage level of the first data signal and greater than a lowest voltage level of the first data signal.

2. The memory controller of claim 1, wherein the control circuit is configured to control the first pull-up variable resistor and/or the first pull-down variable resistor to make a middle voltage level of the first data signal outputted by the first transmitter is equal to the reference voltage used by the memory module.

3. The memory controller of claim 1, wherein a second channel of the plurality of channels comprises:
    a second transmitter, configured to generate a second data signal to the memory module;
    a second pull-up variable resistor, coupled between the supply voltage and an output terminal of the second transmitter; and
    a second pull-down variable resistor, coupled to the output terminal of the second transmitter; and
    wherein the control circuit is further configured to control the second pull-up variable resistor and/or the second pull-down variable resistor according to the reference voltage used by the memory module.

4. The memory controller of claim 3, wherein the control circuit is configured to control the second pull-up variable resistor and/or the second pull-down variable resistor to make a middle voltage level of the second data signal outputted by the second transmitter is equal to the reference voltage used by the memory module.

5. The memory controller of claim 4, wherein the control circuits separately controls the first pull-up/pull-down variable resistor and the second pull-up/pull-down variable resistor so that the middle voltage level of the second data signal is not equal to a middle voltage level of the first data signal.

6. The memory controller of claim 1, wherein the first channel further comprises:
    a first switching circuit, coupled between the first pull-up variable resistor and the supply voltage, configured to connect the supply voltage to the first pull-up variable resistor or disconnect the first pull-up variable resistor from the supply voltage.

7. The memory controller of claim 6, wherein the first switching circuit is controlled by a static mode pull-up signal so that the first switching circuit is always enabled when the first transmitter is enabled.

8. The memory controller of claim 6, wherein the first switching circuit is controlled by a dynamic mode pull-up signal so that the first switching circuit is enabled only when the first transmitter generates the first data signal, and the control circuit enables the first switching circuit bit-by-bit.

9. A memory system, comprising:
a memory controller comprising a plurality of transmitters, wherein the transmitters are configured to generate a plurality of data signals, respectively; and
a memory module comprising a plurality of receivers, wherein the receivers compare the plurality of data signals with a reference voltage to determine logical values of the plurality of data signals to generate a plurality of output signals, respectively;
wherein the plurality of transmitters comprise a first transmitter, the memory controller further comprises a first pull-up variable resistor and a first pull-down variable resistor, wherein the first pull-up variable resistor is coupled between a supply voltage and an output terminal of the first transmitter, and the first pull-down variable resistor is coupled to the output terminal of the first transmitter; and the memory controller further comprises a control circuit configured to control the first pull-up variable resistor and/or the first pull-down variable resistor according to the reference voltage used by the memory module;
wherein the control circuit is configured to control the first pull-up variable resistor and/or the first pull-down variable resistor to make a specific voltage level of a first data signal outputted by the first transmitter is equal to the reference voltage used by the memory module, wherein the specific voltage level of the first data signal is lower than a highest voltage level of the first data signal and greater than a lowest voltage level of the first data signal.

10. The memory system of claim 9, wherein the control circuit is configured to control the first pull-up variable resistor and/or the first pull-down variable resistor to make a middle voltage level of a first data signal outputted by the first transmitter is equal to the reference voltage used by the memory module.

11. The memory system of claim 9, wherein the plurality of transmitters comprise a second transmitter, the memory controller further comprises a second pull-up variable resistor and a second pull-down variable resistor, wherein the second pull-up variable resistor is coupled between the supply voltage and an output terminal of the second transmitter, and the second pull-down variable resistor is coupled to the output terminal of the second transmitter; and the control circuit is further configured to control the second pull-up variable resistor and/or the second pull-down variable resistor according to the reference voltage used by the memory module.

12. The memory system of claim 11, wherein the control circuit is configured to control the second pull-up variable resistor and/or the second pull-down variable resistor to make a middle voltage level of a second data signal outputted by the second transmitter is equal to the reference voltage used by the memory module.

13. The memory system of claim 12, wherein the control circuits separately controls the first pull-up/pull-down variable resistor and the second pull-up/pull-down variable resistor so that the middle voltage level of the second data signal is not equal to a middle voltage level of the first data signal.

14. A control method of a memory controller, wherein the memory controller comprises a plurality of channels, and a first channel of the plurality of channels comprises:
a first transmitter;
a first pull-up variable resistor, coupled between a supply voltage and an output terminal of the first transmitter; and
a first pull-down variable resistor, coupled to the output terminal of the first transmitter; and
the control method comprises the steps of:
controlling the first pull-up variable resistor and/or the first pull-down variable resistor according to a reference voltage used by a memory module;
wherein the step of controlling the first pull-up variable resistor and/or the first pull-down variable resistor according to the reference voltage used by the memory module comprises:
controlling the first pull-up variable resistor and/or the first pull-down variable resistor to make a specific voltage level of a first data signal outputted by the first transmitter is equal to the reference voltage used by the memory module, wherein the specific voltage level of the first data signal is lower than a highest voltage level of the first data signal and greater than a lowest voltage level of the first data signal.

15. The control method of claim 14, wherein the step of controlling the first pull-up variable resistor and/or the first pull-down variable resistor according to the reference voltage used by the memory module comprises:
controlling the first pull-up variable resistor and/or the first pull-down variable resistor to make a middle voltage level of a first data signal outputted by the first transmitter is equal to the reference voltage used by the memory module.

16. The control method of claim 14, wherein a second channel of the plurality of channels comprises:
a second transmitter;
a second pull-up variable resistor, coupled between the supply voltage and an output terminal of the second transmitter; and
a second pull-down variable resistor, coupled to the output terminal of the second transmitter; and
the control method further comprises:
controlling the second pull-up variable resistor and/or the second pull-down variable resistor according to the reference voltage used by the memory module.

17. The control method of claim 16, wherein the step of controlling the second pull-up variable resistor and/or the second pull-down variable resistor according to the reference voltage used by the memory module comprises:
controlling the second pull-up variable resistor and/or the second pull-down variable resistor to make a middle voltage level of the second data signal outputted by the second transmitter is equal to the reference voltage used by the memory module.

18. The control method of claim 17, wherein the first pull-up/pull-down variable resistor and the second pull-up/pull-down variable resistor are separately controlled so that the middle voltage level of the second data signal is not equal to a middle voltage level of the first data signal.

19. The memory controller of claim 1, wherein the reference voltage is used by the memory module to compare with the first data signal to determine a logical value of the first data signal.

20. The control method of claim 14, wherein the reference voltage is used by the memory module to compare with the first data signal to determine a logical value of the first data signal.

* * * * *